US012813029B2

(12) United States Patent
Chaji

(10) Patent No.: US 12,813,029 B2
(45) Date of Patent: Nov. 24, 2026

(54) COLOR CONVERSION SOLID STATE DEVICE

(71) Applicant: VueReal Inc., Waterloo (CA)

(72) Inventor: Gholamreza Chaji, Waterloo (CA)

(73) Assignee: VueReal Inc., Waterloo (CA)

(*) Notice: Subject to any disclaimer, the term of this patent is extended or adjusted under 35 U.S.C. 154(b) by 634 days.

(21) Appl. No.: 17/928,965

(22) PCT Filed: Jun. 3, 2021

(86) PCT No.: PCT/CA2021/050762
§ 371 (c)(1),
(2) Date: Dec. 1, 2022

(87) PCT Pub. No.: WO2021/243463
PCT Pub. Date: Dec. 9, 2021

(65) Prior Publication Data
US 2023/0335683 A1 Oct. 19, 2023

Related U.S. Application Data

(60) Provisional application No. 63/034,138, filed on Jun. 3, 2020.

(51) Int. Cl.
*H01L 33/50* (2010.01)
*H10H 20/01* (2025.01)
*H10H 20/851* (2025.01)
*H10H 20/853* (2025.01)
(Continued)

(52) U.S. Cl.
CPC ........ *H10H 20/8512* (2025.01); *H10H 20/01* (2025.01); *H10H 20/853* (2025.01); *H10H 20/856* (2025.01); *H10H 29/142* (2025.01)

(58) Field of Classification Search
CPC ............. H10H 20/8512; H10H 20/856; H10H 29/142; H10H 20/0361; H10H 20/0362; H10H 20/0363; H10H 20/882; H10H 20/854; H10H 20/855; H01L 25/0753; H01L 25/167; H01L 24/97; H01L 2924/12041; H10D 86/021
See application file for complete search history.

(56) References Cited

U.S. PATENT DOCUMENTS

| | | | | |
|---|---|---|---|---|
| 2004/0233671 A1 | 11/2004 | Staufert | | |
| 2007/0295968 A1* | 12/2007 | Tan | ...................... | H10H 20/854 257/E33.059 |
| 2009/0272996 A1 | 11/2009 | Chakraborty | | |

(Continued)

FOREIGN PATENT DOCUMENTS

| | | |
|---|---|---|
| TW | 201232094 A | 8/2012 |
| WO | 2014204694 A1 | 12/2014 |

OTHER PUBLICATIONS

ROC: TW Office Action relating to TW application No. 110120308, dated Feb. 13, 2025.

(Continued)

*Primary Examiner* — Elmito Breval

(57) ABSTRACT

The disclosure is related to creating different functional micro devices by integration of functional tuning materials and to creating encapsulation capsules to protect these materials. The disclosure also relates to a solid state device and a method to convert a color of a light emitting device into another color.

26 Claims, 20 Drawing Sheets

(51) Int. Cl.
*H10H 20/856* (2025.01)
*H10H 29/14* (2025.01)

(56) References Cited

U.S. PATENT DOCUMENTS

| | | | | |
|---|---|---|---|---|
| 2010/0213835 | A1 | 8/2010 | Mo et al. | |
| 2011/0001151 | A1 | 1/2011 | Le Toquin | |
| 2011/0147775 | A1 | 6/2011 | Hikosaka et al. | |
| 2012/0057239 | A1 | 3/2012 | Shiojiri et al. | |
| 2012/0132944 | A1 | 5/2012 | Sieh et al. | |
| 2014/0118661 | A1 | 5/2014 | Qi et al. | |
| 2014/0167599 | A1 | 6/2014 | Sugiura | |
| 2014/0185282 | A1 | 7/2014 | Hsu et al. | |
| 2014/0339495 | A1 | 11/2014 | Bibl et al. | |
| 2014/0367633 | A1 | 12/2014 | Bibl et al. | |
| 2015/0069430 | A1* | 3/2015 | Collins | H10H 20/851 257/89 |
| 2015/0204490 | A1* | 7/2015 | Zheng | H01L 25/0753 362/235 |
| 2017/0315404 | A1* | 11/2017 | Ye | H10H 20/8511 |
| 2018/0097037 | A1 | 4/2018 | Chaji | |
| 2018/0122836 | A1 | 5/2018 | Kang et al. | |
| 2018/0294254 | A1 | 10/2018 | Chen et al. | |
| 2020/0013761 | A1 | 1/2020 | Chaji et al. | |

OTHER PUBLICATIONS

WIPO: PCT International Search Report and Written Opinion relating to PCT application No. PCT/CA2021/050762, dated Aug. 11, 2021.

KR: KR Office Action relating to KR application No. 10-2022-7043748, dated Jun. 24, 2025.

PRC (China): CN Office Action relating to CN application No. 202180039163.9, dated Aug. 4, 2025.

ROC: TW Office Action relating to TW application No. 110120308, dated Jan. 13, 2026.

PRC (China): CN Office Action relating to CN application No. 202180039163.9, dated Mar. 7, 2026.

IN (India): IN Office Action relating to IN application No. 202247076012, dated Mar. 20, 2026.

* cited by examiner

COLOR CONVERSION SOLID STATE DEVICE

BACKGROUND AND FIELD OF THE INVENTION

The present invention relates to an integration of color conversion layers into a display substrate. More particularly, the present invention relates to providing an encapsulation capsule to protect the color conversion layers from environmental agents.

System performance can be enhanced by integrating different micro-devices into a system substrate. The challenge is that different micro-devices can have different performance and also use different material systems. These material systems are in general sensitive to environmental agents (e.g., oxygen or water). Therefore, it is desirable to provide protection to these materials to enhance the system performance.

BRIEF SUMMARY

According to one embodiment, this invention relates to a solid state device that is enabled to convert a color of a light emitting device into another color, the device comprising of, a backplane, a light emitting device on top of the backplane, a light distribution layer on top of the light emitting device, and a color conversion layer on top of the light distribution layer.

According to another embodiment, there is given a method to convert a color of a light emitting device into another color, the method comprising, forming a backplane, forming a light emitting device on top of the backplane, forming a light distribution layer on top of the light emitting device, forming a color conversion layer on top of the light distribution layer, and converting the color of the light emitting device into another color that is different from the original color of light emitting device.

BRIEF DESCRIPTION OF THE DRAWINGS

The foregoing and other advantages of the disclosure will become apparent upon reading the following detailed description and upon reference to the drawings.

Figure 1:
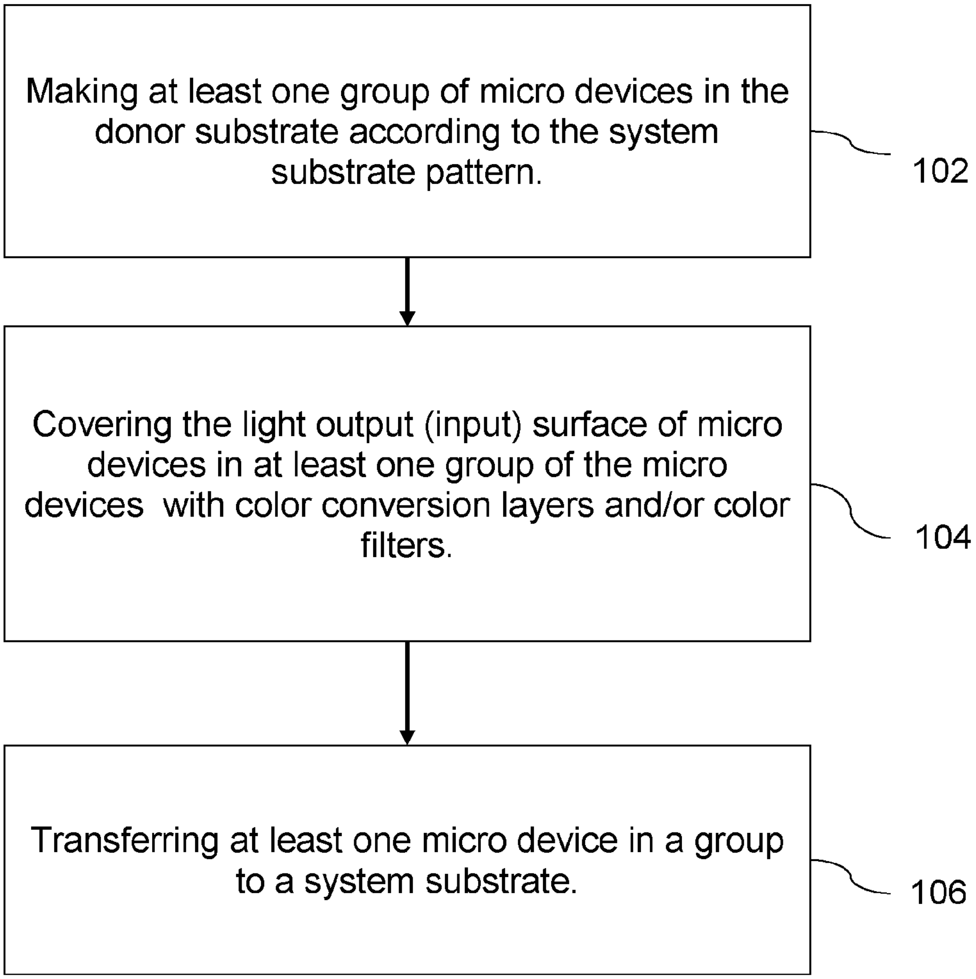
FIG. 1 illustrates a flow diagram for a method in accordance with an embodiment.

While the present disclosure is susceptible to various modifications and alternative forms, specific embodiments or implementations have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

DETAILED DESCRIPTION

One method to improve the system performance is to integrate different micro-devices into a system substrate. The challenge is that different micro-devices can have different performance and also use different material systems. This invention is related to creating different functional micro-devices (e.g., red, green, blue LED or sensor from single blue LED) by integration of functional tuning materials (e.g., color conversion layer). The functional tuning materials are in general sensitive to environmental agents (e.g., oxygen or water).

Another aspect of this invention is to create encapsulation capsules to protect these materials.

In this disclosure, the structure is described using micro-LED and color conversion layers. However, similar structures can be used with other micro-devices and other functional tuning materials.

The shape of light sources used in the embodiments are for the purpose of illustration and devices can have different shapes. The light source devices can have one or more pads on side that will contact the receiver substrate. The pads can be mechanical, electrical or combination of both. The one or more pads can be connected to common electrodes or row/column electrodes. The electrodes can be transparent or opaque. The light sources can have different layers. The light sources can be made of different materials such as organic, inorganic, or combination of them.

With reference to FIG. 1, the method of manufacturing the pixel circuit comprises: step 102, e.g. making at least one group of micro-devices on a donor substrate according to a system substrate pattern; step 104, e.g. covering the light output (input) surface of the micro-devices with the color conversion layers and/or color filters; and step 106, e.g. transferring at least one of the micro-devices in a group to a system substrate.

Figure 2:
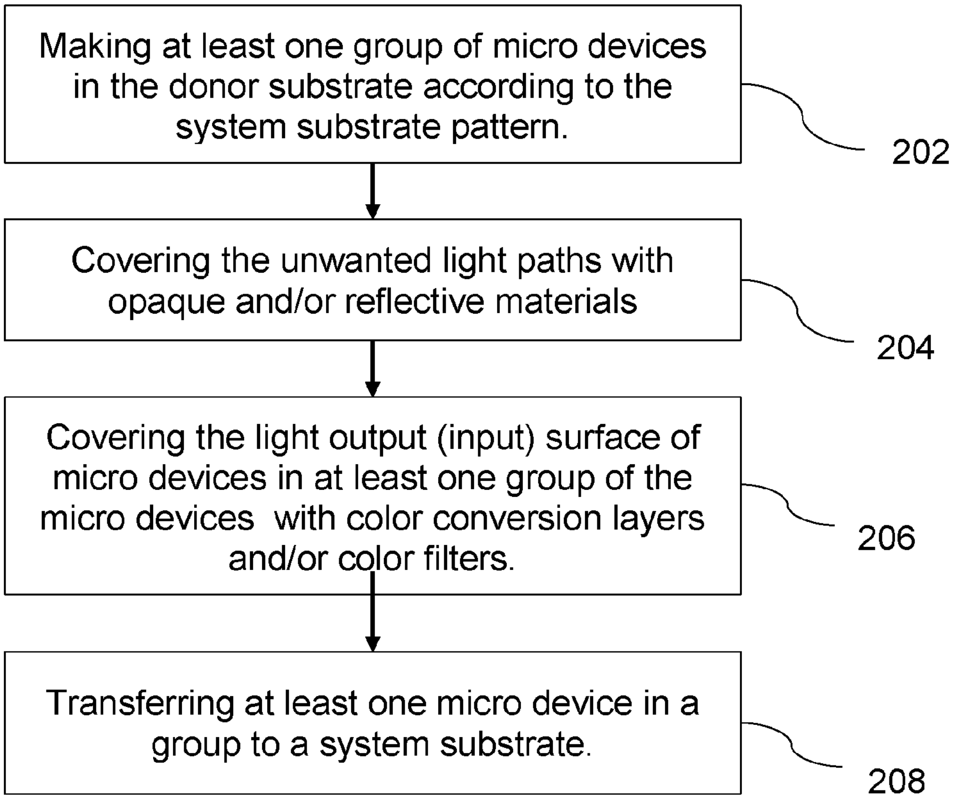
FIG. 2 illustrates a flow diagram for an alternative method in accordance with an embodiment.

With reference to FIG. 2, the method of manufacturing the pixel circuit comprises: step 202, e.g. making at least one group of micro-devices on a donor substrate according to a system substrate pattern; step 204, e.g. covering or blocking undesired light paths from the micro-devices with opaque or reflective materials, e.g. light attenuator; step 206, e.g. covering the light output (input) surface of the micro-devices with the color conversion layers and/or color filters; and step 208, e.g. transferring at least one of the micro-devices and in a group to a system substrate.

Figure 3:
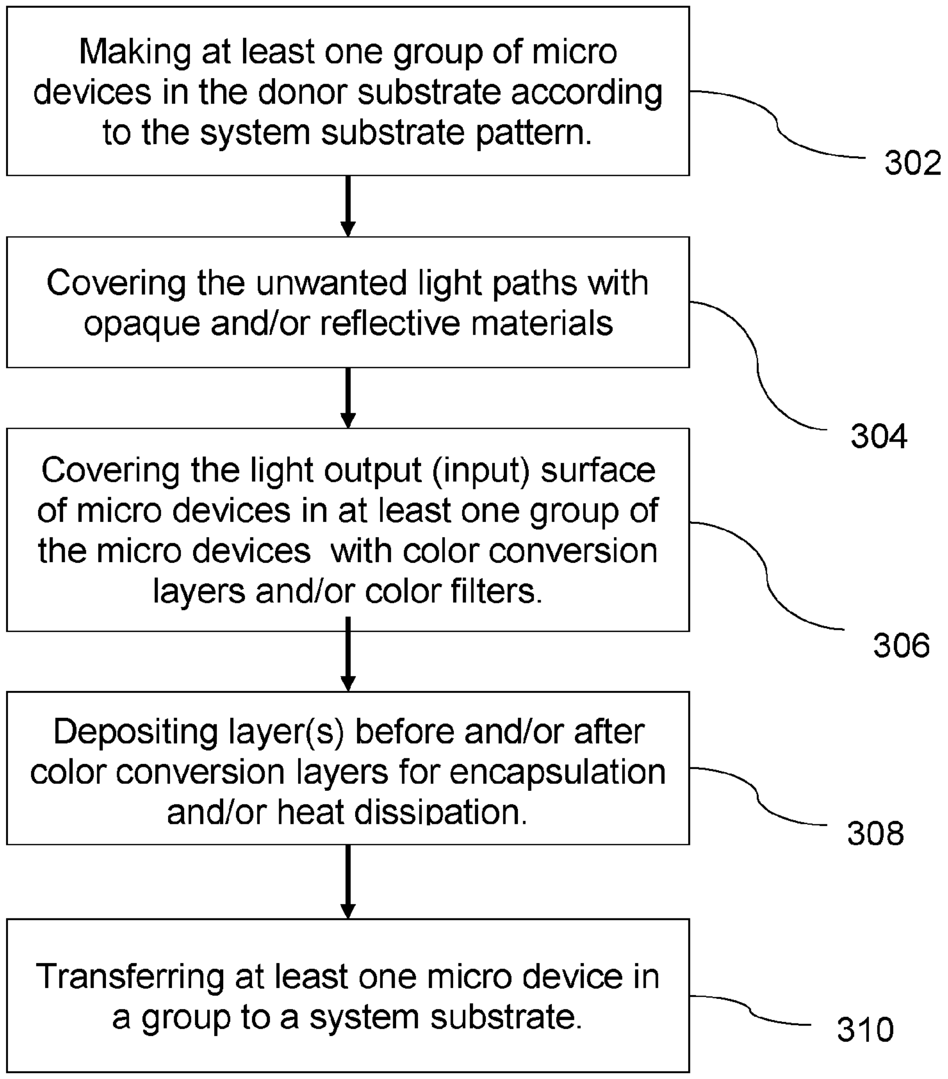
FIG. 3 illustrates a flow diagram for an alternative method in accordance with an embodiment.

With reference to FIG. 3, the method of manufacturing the pixel circuit comprises: step 302, e.g. making at least one group of micro-devices on a donor substrate according to a system substrate pattern; step 304, e.g. covering or blocking undesired light paths from the micro-devices with opaque or reflective materials, e.g. light attenuator; step 306, e.g. covering the light output (input) surface of the micro devices with the color conversion layers and/or color filters; step 308, depositing layers before and/or after the color conversion layers for encapsulation and/or heat dissipation; and step 310, e.g. transferring at least one of the micro-devices in a group to a system substrate.

Figure 4:
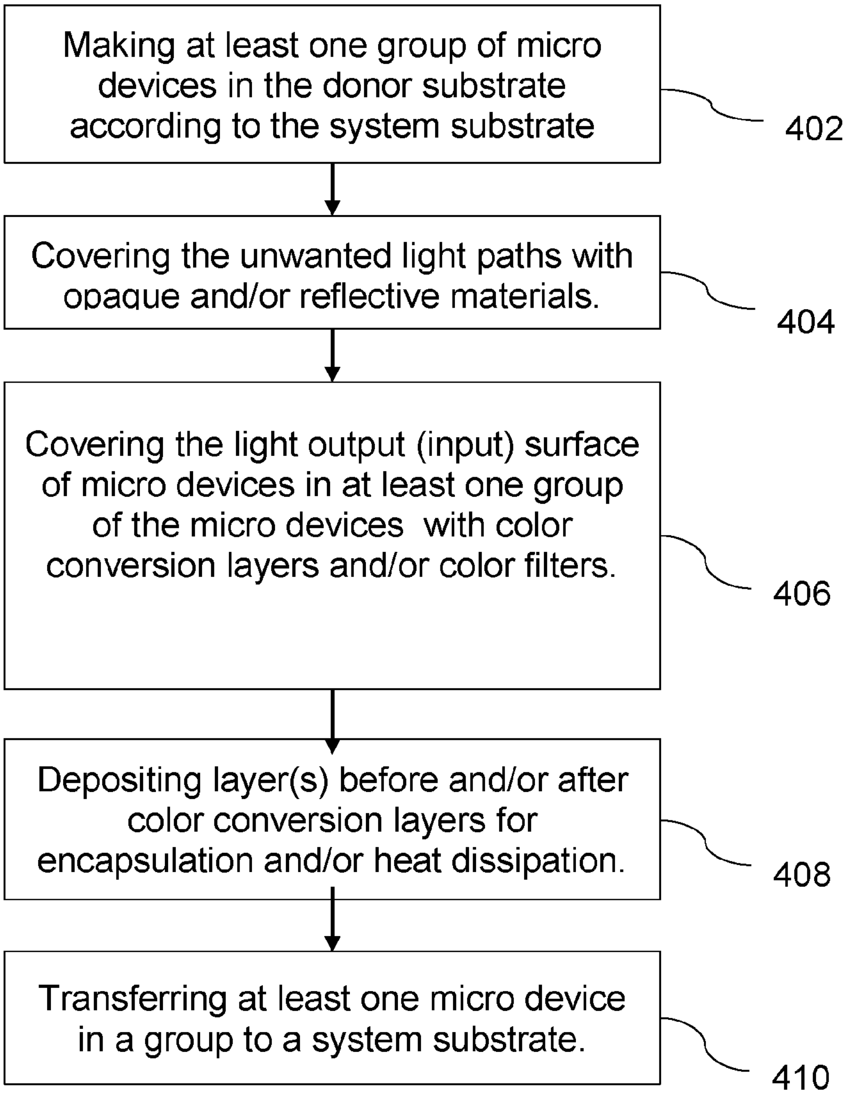
FIG. 4 illustrates a flow diagram for alternative methods in accordance with an embodiment.

With reference to FIG. 4, the method of manufacturing the pixel circuit comprises: step 402, e.g. making at least one group of micro-devices on a donor substrate according to a system substrate pattern; step 404, e.g. covering or blocking undesired light paths from the micro-devices with opaque or reflective materials, e.g. light attenuator; step 406, e.g. covering the light output (input) surface of the micro-devices with the color conversion layers and/or color filters, wherein the color conversion layers may include a dielectric layer for passivation; step 408, depositing layers before and/or after the color conversion layers for encapsulation and/or heat dissipation; and step 410, e.g. transferring at least one of the micro-devices in a group to a system substrate.

Figure 5:
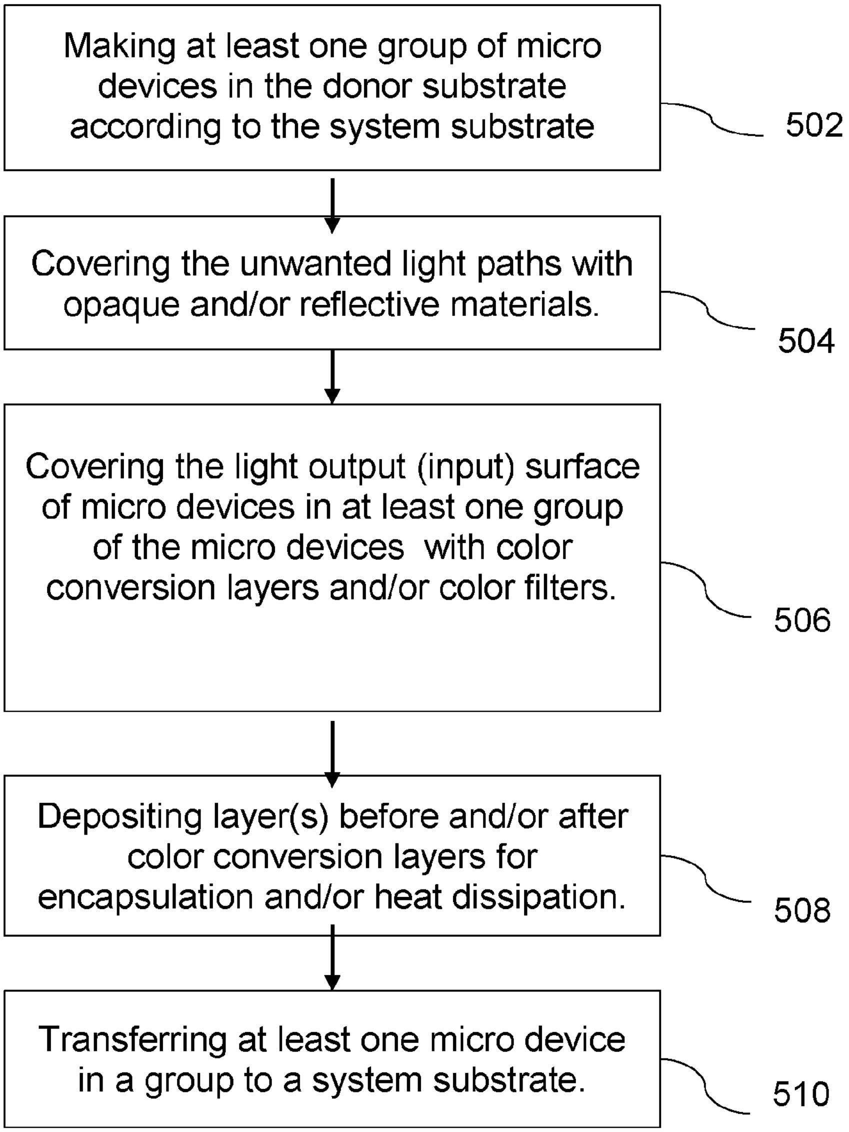
FIG. 5 illustrates a flow diagram for alternative methods in accordance with an embodiment.

With reference to FIG. 5, the method of manufacturing the pixel circuit comprises: step 502, e.g. making at least one group of micro-devices on a donor substrate according to a system substrate pattern; step 504, e.g. covering or blocking undesired light paths from the micro-devices with opaque or reflective materials, e.g. light attenuator; step 506, e.g. covering the light output (input) surface of the micro-devices with the color conversion layers and/or color filters, wherein one of the color conversion layers or the light attenuator may include a conductive layer acting as an electrode for the micro-device; step 508, depositing layers before and/or after the color conversion layers for encapsulation and/or heat dissipation; and step 510, e.g. transferring at least one of the micro-devices in a group to a system substrate.

Figure 6:
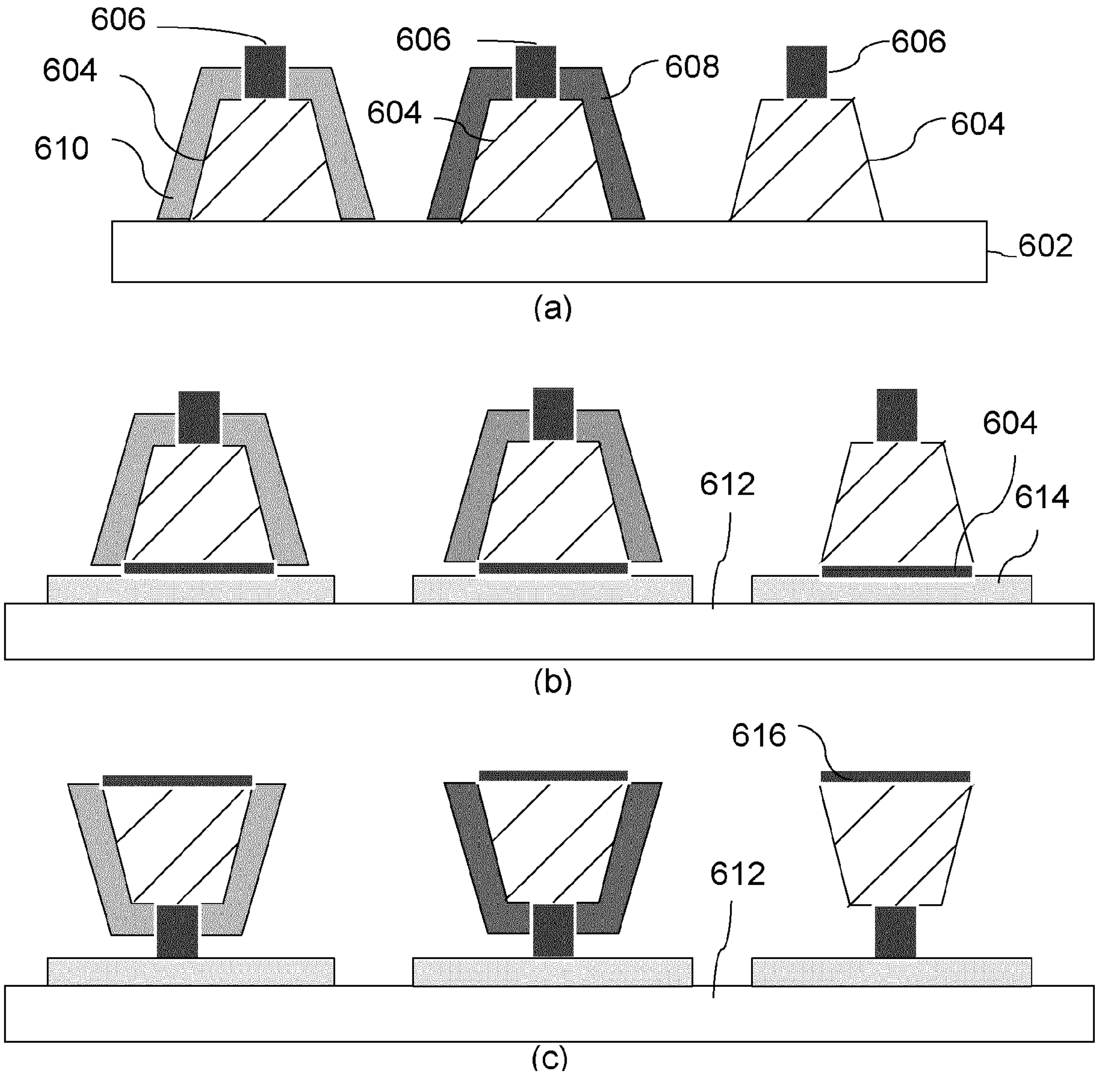
FIG. 6 illustrates various embodiments of the present invention.

With reference to FIGS. 6A to 6C, the transfer process is illustrated, in which a donor substrate 602 initially includes three micro-devices 604. Each of the micro-device 604 includes an electrode 606, which may be transparent, but ideally comprises an opaque or reflective material providing a light attenuator function. The middle micro-device 604 includes, e.g. is coated with, a first color conversion or filter layer 608 for converting the emitted light from the micro-device 604 into a different color. The left micro-device 604 includes, e.g. is coated with, a second color conversion or filter layer 610 for converting the emitting light from the micro-device 604 into a third color. Together the three micro-devices 604 may comprise the three different colors, e.g. red, green and blue, required to form a pixel for a display device. One can add a spare micro-device to each set of the devices related to a pixel in the system substrate. After testing the micro-devices on the donor (cartridge) substrate, one can remap the functional tuning materials for each micro-devices to make sure there is an acceptable number of micro-devices for different pixels in the system substrate. For example, if the device allocated the green color conversion is not functioning, the spare red and green color conversion can be allocated to the two devices out of the original devices and the spare device.

In a first embodiment, the three micro-devices 604 are transferred to a cartridge substrate, and provided with a second electrode 616 mounted on the opposite end of the micro-device 604 as the electrode 606. The second electrode 616 may comprise of an opaque or a reflective material for redirecting any light from the micro-device 604 back through any light distribution material, around any light attenuator structure and through any color conversion layer 608 or 610. Each of the micro-devices 604 are then mounted on pads 614 on a receiver substrate 612 (FIG. 6B), with the second electrode 616 in electrical contact with the pad 614.

Alternatively, as illustrated in FIG. 6C, the three micro-devices 604 may be directly transferred to the receiver substrate 612 with the electrode 606 in contact with the pads 614. In this embodiment, the receiver substrate 612 and the pads 614 may be transparent to the light emitted from the micro devices 604 and any subsequent conversion.

Figure 7A:
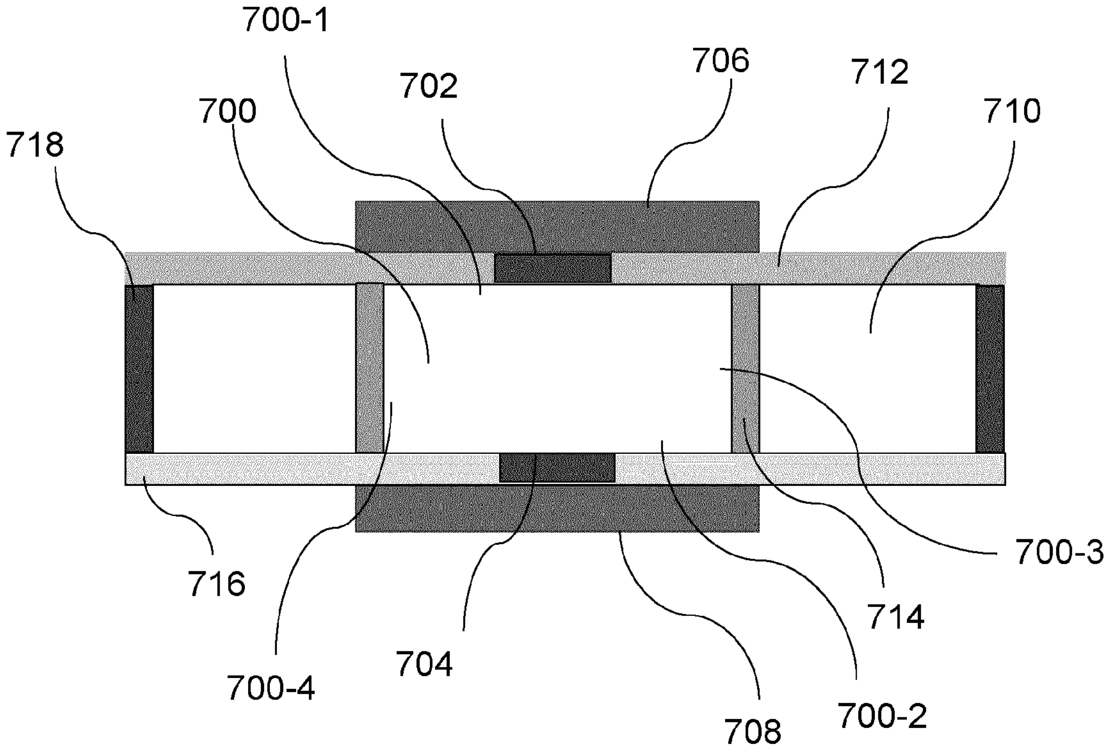
FIG. 7A-7C illustrates cross-sectional views of integration of micro-devices with color conversion layers in accordance with an embodiment.

FIG. 7A shows a micro-device 700 embedded in functional tuning/alteration/modifying materials 710 referred to as color conversion layers as an example in the rest of the description. Here, a plurality of semiconductor layers are formed/transferred into a substrate forming a top surface 700-1 and a bottom surface 700-2. The plurality of the semiconductor layers are isolated in different areas forming micro-devices (a micro-device 700 is shown as an example) with at least one side surface 700-3 (or 700-4). Here, the micro-device 700 can have at least one contact (via) 702, 704 on at least one side of the device (or just one side). The contacts 702, 704 are connecting the device 700 to pads 706, 708. The micro-device 700 can have a stack of different layers such as active layers sandwiched between charge blocking layers and doping layers. A space formed around the micro-device 700 created by at least one cover layer which is optically coupled to the at least one side surface 700-3 (or 700-4). The space/housing structure formed around the device consists of one or more cover walls 712, 714, 716, and 718. The top and bottom cover walls (layers) 712, 714 extend beyond the at least one side surface 700-3, 700-4 of the micro-device 700. The functional tuning materials (e.g. color conversion materials) 710 are inside the housing structure. The cover walls 712, 714, 716, and 718 can be encapsulation layers to protect the color conversion materials from oxygen and moisture. The color conversion materials can be phosphor or quantum dots. In addition, the cover walls can include optical enhancement layers having some optical property to enhance the light coupling into the color conversion materials. In one case, the cover wall 712 or 716 can be reflective layers to reflect the light into the color conversion materials. In another case, the cover wall 712 or 716 are designed to only reflect small wavelengths (e.g. smaller than 450 nm) while it allows the longer wavelength goes through. This allows the converted light to pass through the wall. In another case, the wall 714 enhances the light extraction from the micro-device 700 into color conversion material 710. In one example, the wall 718 is reflective to reflect back the lights. In another case, the wall 718 is transparent allowing at least some wavelength to pass through.

Figure 7B:
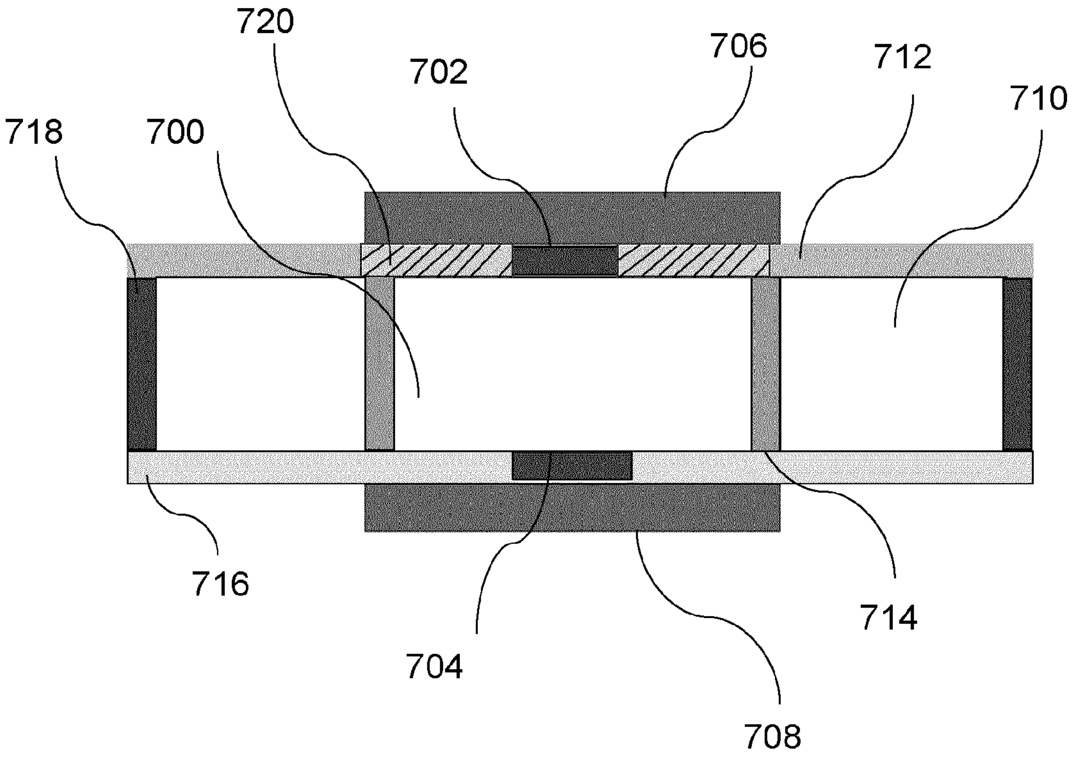

With reference to FIG. 7B, the cover walls 712 or 716 can have two parts, a reflective part 720 and a transparent part. The reflective layer 720 is extended on top (or can be extended to bottom side) side of the device 700. In one case, the transparent part can also be only transparent to a portion of wavelength to block the micro-device light going out directly without being converted.

Figure 7C:
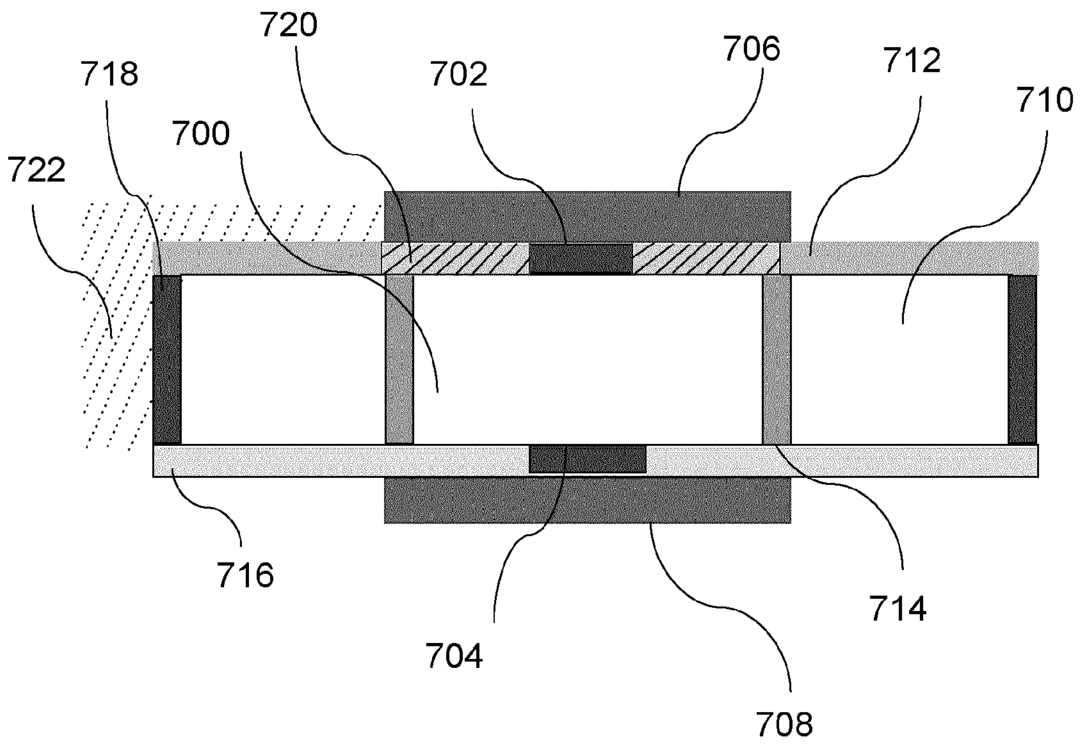

In another case shown in FIG. 7C, color filter layers 722 can be deposited on at least one of the walls to further prevent some of the wavelength to get out of the structure/ device 700 or get into the color conversion material 710 from the outside.

Figure 8A:
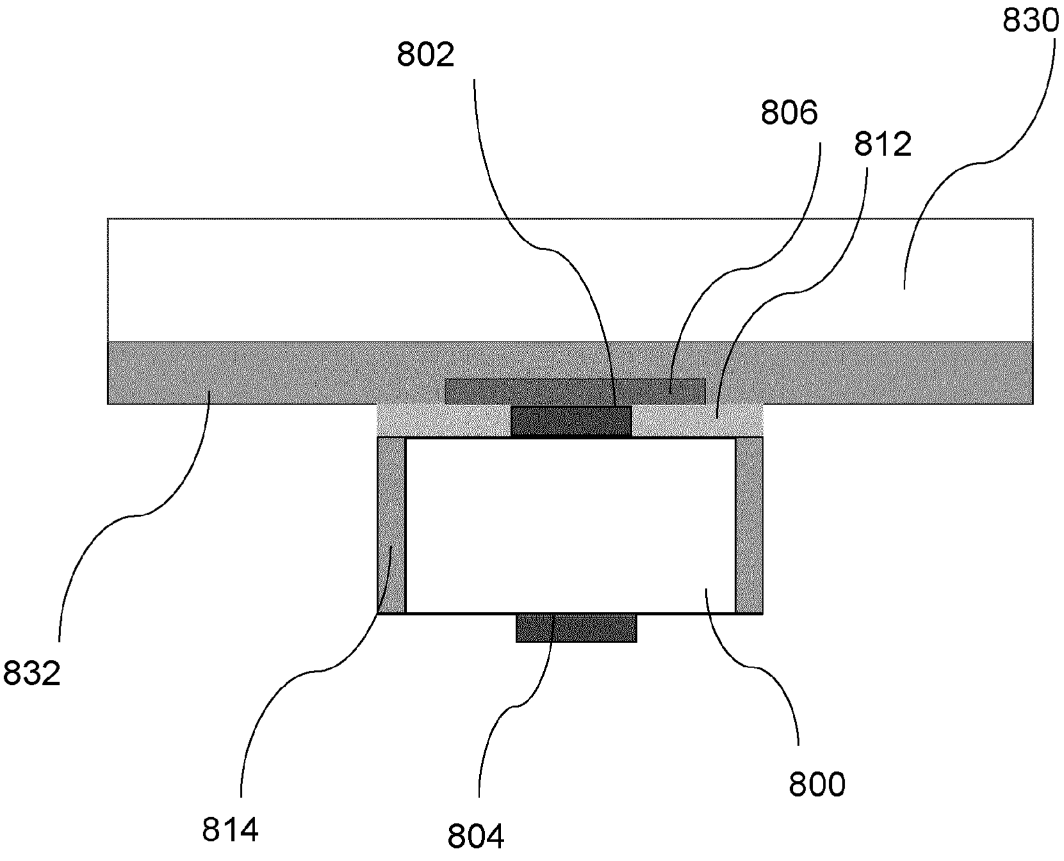
FIG. 8A illustrates a cross-sectional view of integration of micro-devices with color conversion layers and contacts in accordance with an embodiment.

FIG. 8A shows a micro-device 800 with contacts 802, 804 on either top or bottom sides. A pad 806 can couple to the device 800 through at least one of the contacts e.g., the contact 802 at the top side. In one case, a layer 812 that can be dielectric is covering the part of the device surface that is not covered by the contact 802. There can be side surfaces 814 which can have different functions such as passivation layer, optical enhancement layer, or encapsulation layer. Here, a buffer or sacrificial layer 832 is between the micro-device 800 and a substrate 830.

Figure 8B:
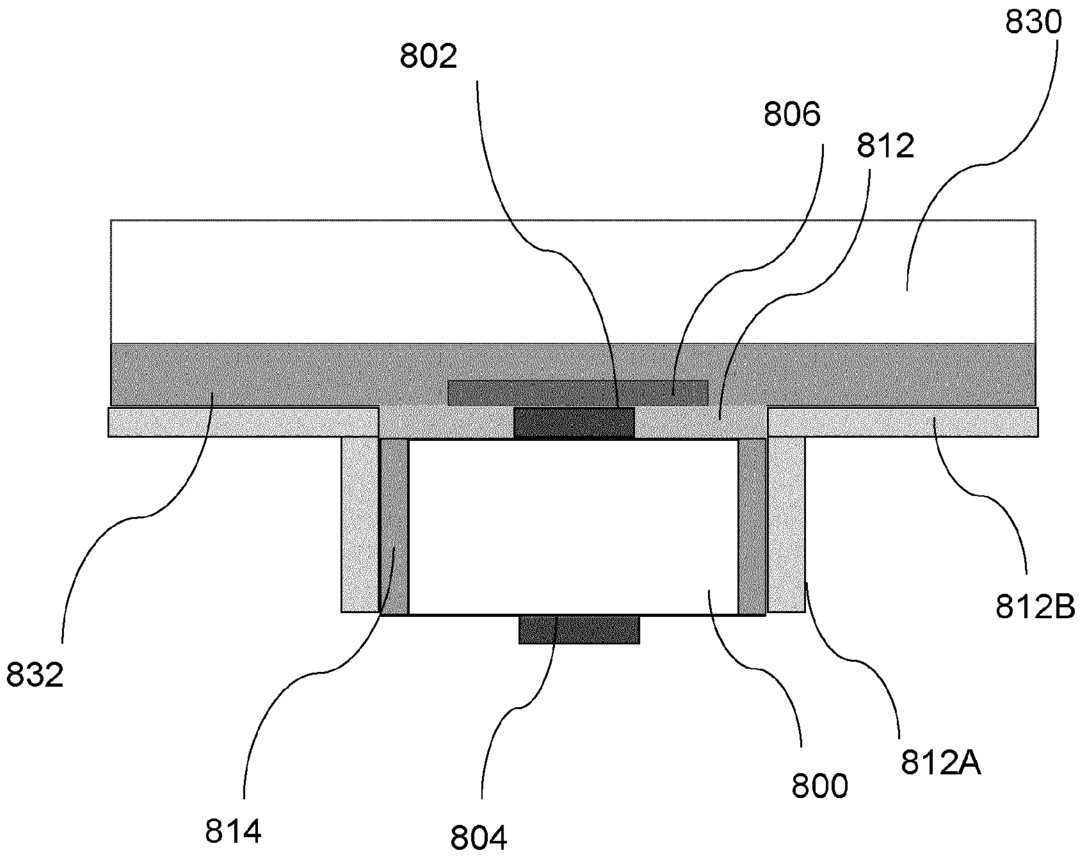
FIG. 8B illustrates a cross-sectional view of integration of micro-devices with color conversion layers and encapsulation walls in accordance with an embodiment.

FIG. 8B shows where encapsulation walls 812A and 812B are formed. The encapsulation layer 812A can be the same as side surfaces 814. These side surfaces 814 can be deposited by different means such as printing, evaporation, printing, sputtering or more. The sidewall layers can be patterned by traditional photolithography, liftoff, or printing.

Figure 8C:
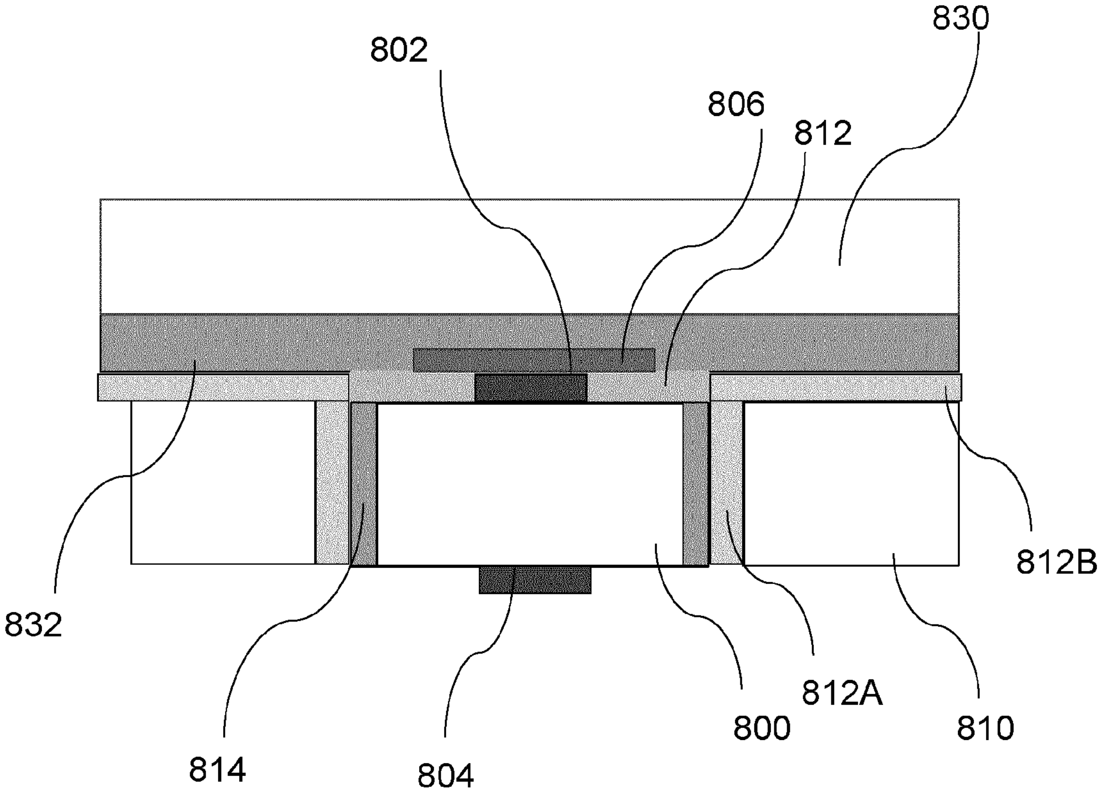
FIG. 8C illustrates a cross-sectional view of integration of micro-devices with color conversion layers in accordance with an embodiment.

FIG. 8C shows where the color conversion materials are formed on top of the 812B encapsulation wall. The color conversion layer 810 can cover the side of the device 800 not facing the substrate 830.

Figure 8D:
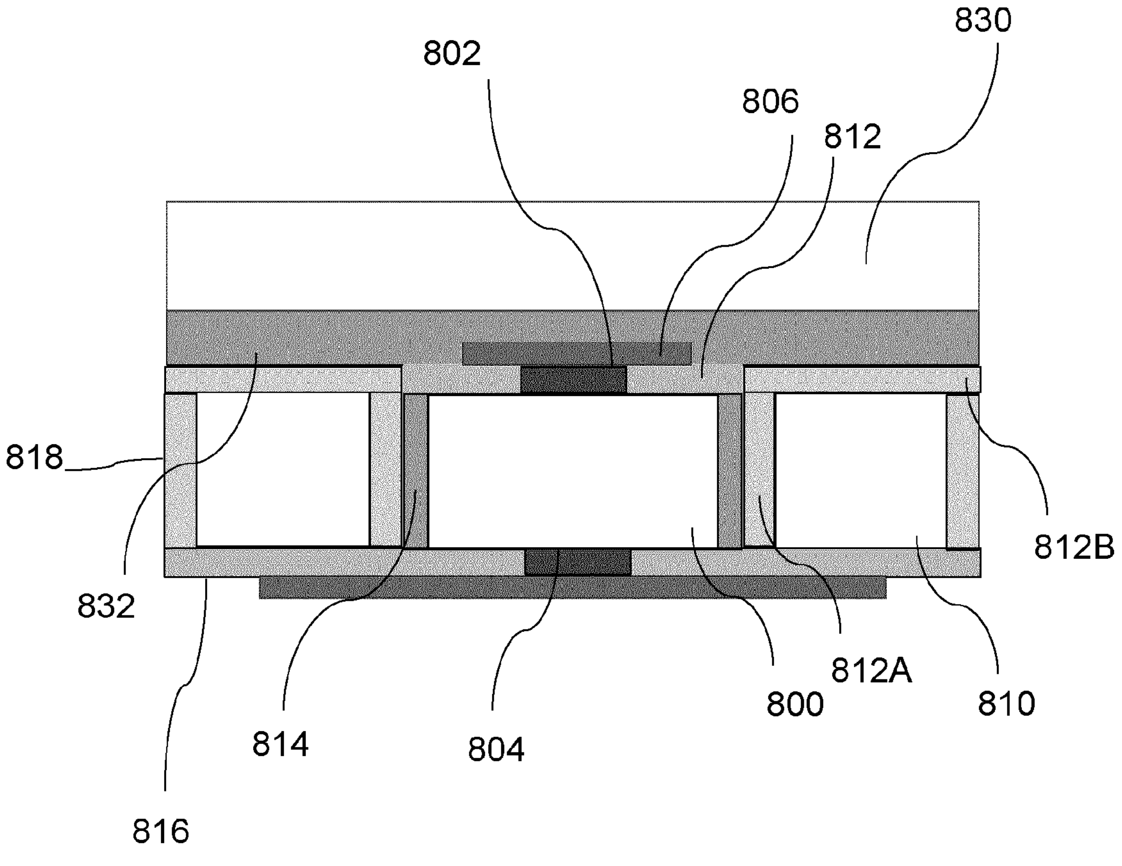
FIG. 8D illustrates a cross-sectional view of integration of micro-devices with color conversion layers in accordance with an embodiment.

FIG. 8D shows the structure where the cover walls 816 and 818 are formed to enclose the color conversion material between the walls 818, 812, and 816.

Figure 8E:
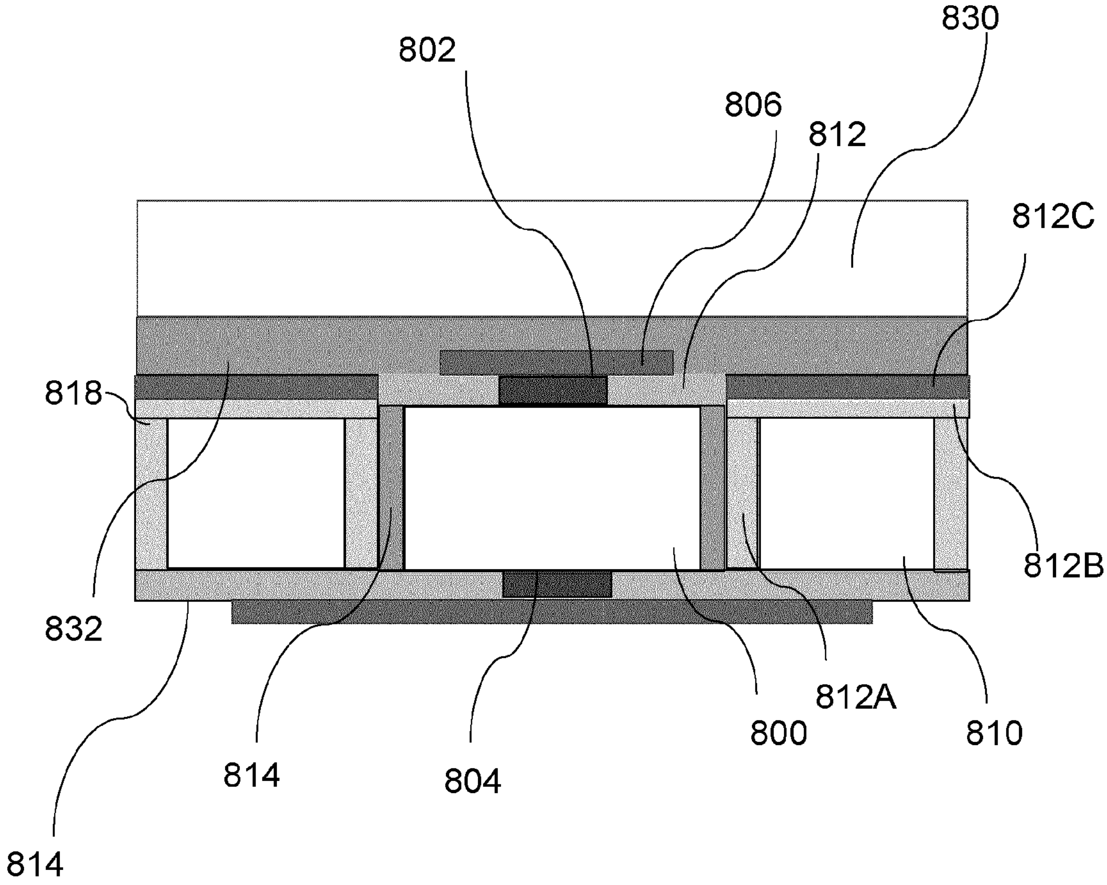

In another embodiment, as shown in FIG. 8E, the walls can have a stack of different layers with different functionalities. In one case, the walls can include a reflective (e.g., total, or selective) 812C and encapsulation layers 812B.

Figure 8F:
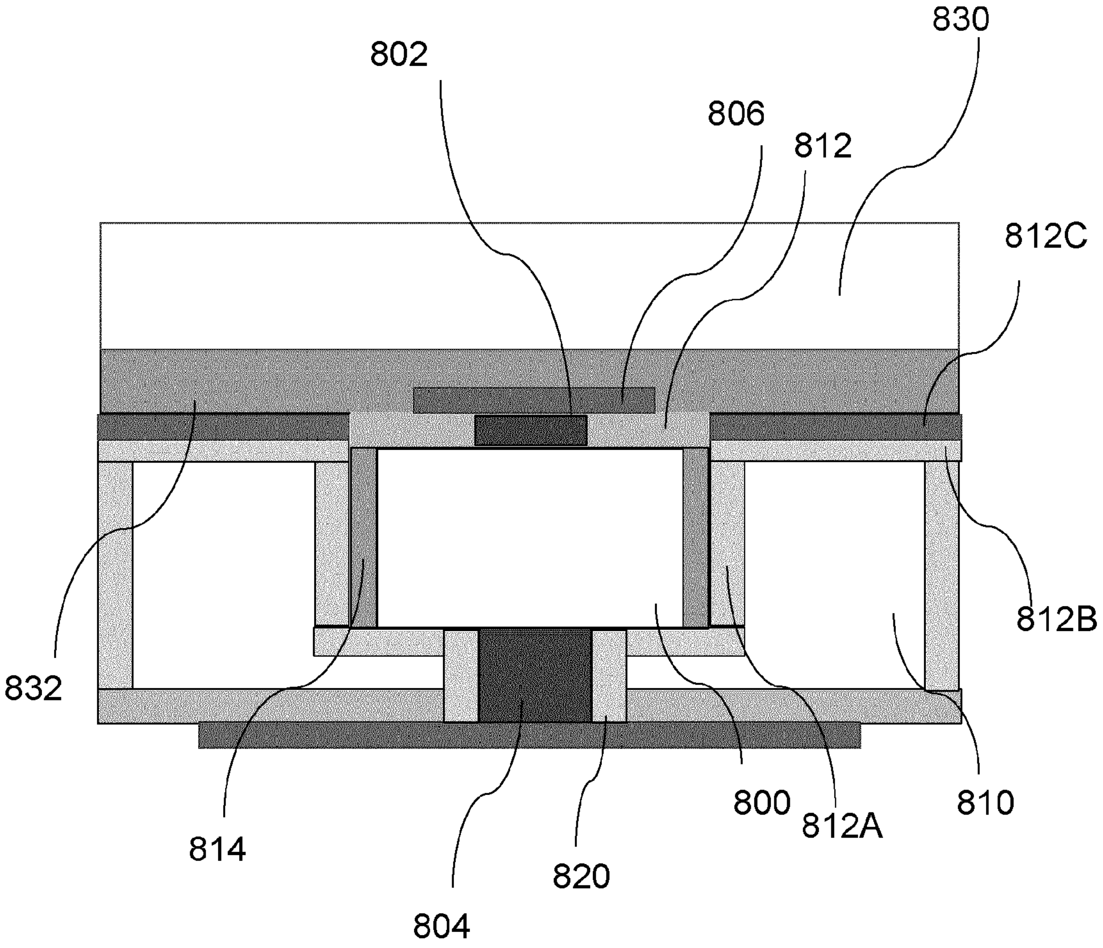

In another embodiment, the color conversion layer can be on the top or bottom surface of the micro-device 800. In one example as shown in FIG. 8F, if there is a contact on the same surface, the contact 804 height will be increased to extend beyond the color conversion layer on that surface. It is possible to add walls 820 to cover the side of the contact 804 and the said surface of the micro-device 800.

Figure 9A:
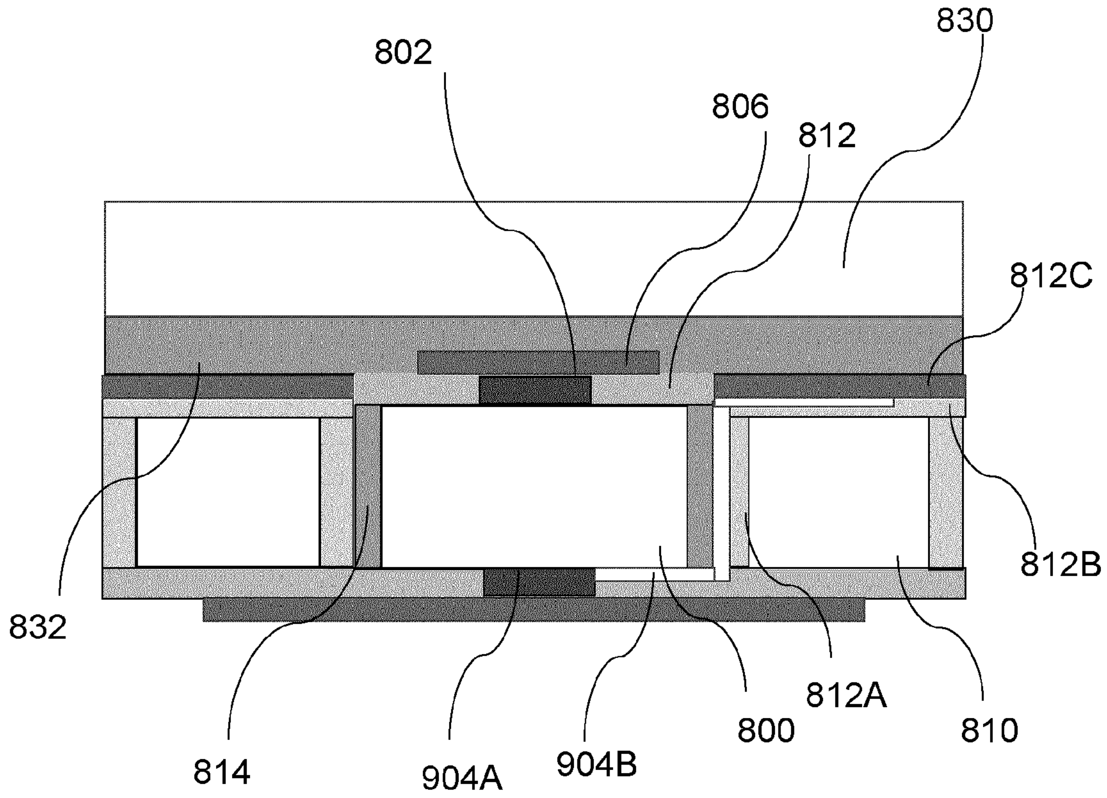
FIG. 9A illustrates a cross-sectional view of integration of micro-devices with color conversion layers in accordance with an embodiment.

In another embodiment shown in FIG. 9A, the contact 904A on one of the surfaces can be connected to a contact 802 area on the opposite side of the device 800 through a trace 904B. The trace can be separated from the device by a dielectric layer. The trace needs to be transparent at some areas to allow the lights to pass through it and coupled with the color conversion layers. In another case, the trace is covering only part of the side of the micro-device so that the light can pass through other areas. For better encapsulation, the wall layers 812A, and 812B used for encapsulation are formed after the trace 904B.

Figure 9B:
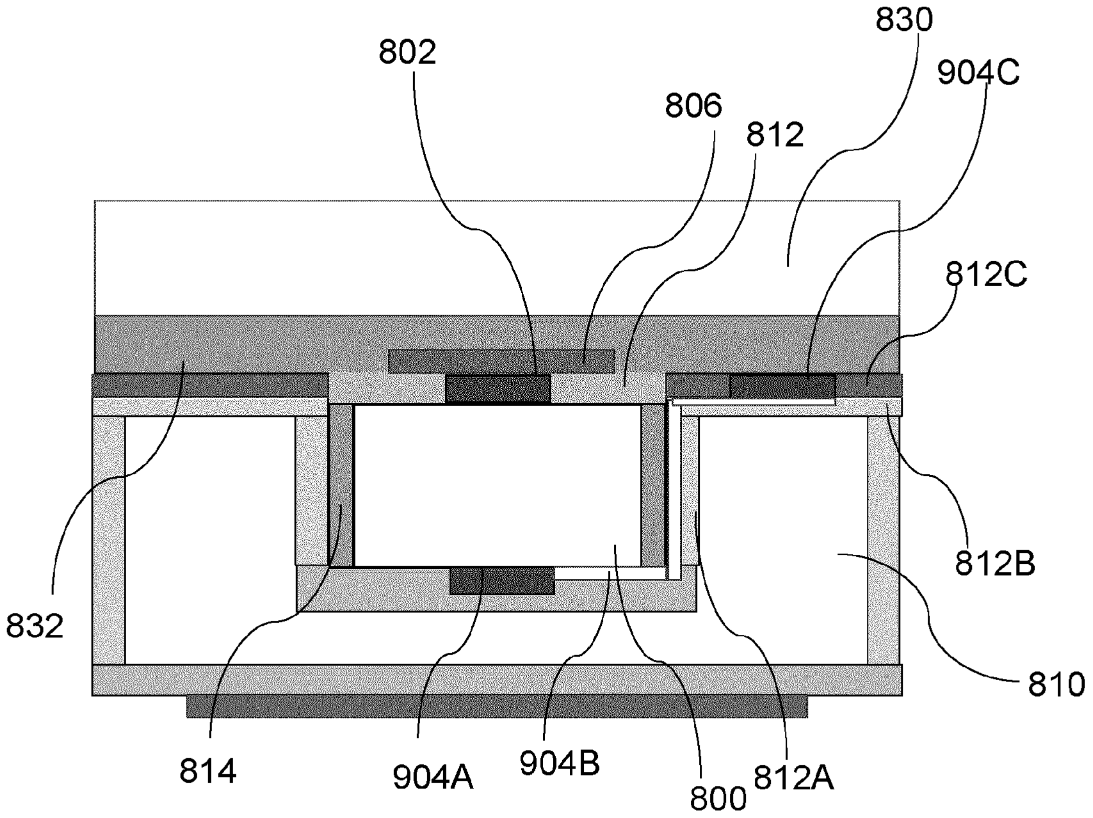
FIG. 9B illustrates a cross-sectional view of integration of micro-devices with color conversion layers in accordance with an embodiment.

In another embodiment, the color conversion layers can be on the top or bottom surface of the micro-device 800. In one example as shown in FIG. 9B, if there is a contact on the same surface, the contact 904A is transferred to another contact 904C on the other area with trace 904B. Here, a wall can cover the contact 904A, trace 904B and the surface of the micro-device for optical or encapsulation function.

In the above embodiment, the cover walls on top and bottom surface and the one on the side can be an extension of each other to offer better protection. In another case, the cover wall (layer) used on the side can extend over the bottom or top cover walls (layers).

According to one embodiment, an optoelectronic device is provided. The optoelectronic device comprising a plurality of semiconductor layers formed on a substrate forming a top surface and a bottom surface, wherein the plurality of semiconductor layers having isolated areas forming at least one side surface; one or more cover layers form a space around the isolated areas optically coupled to the at least one side surface; and functional tuning materials disposed in the space formed by the one or more cover layers.

According to other embodiments, the one or more cover layers comprises one or more of: a passivation layer, a dielectric layer, an optical enhancement layer, an encapsulation layer, a reflective layer, and a color filter layer and functional tuning materials comprises color conversion materials.

According to some embodiment, the functional tuning materials are further disposed of on one of: the top surface and the bottom surface of the optoelectronic device.

According to further embodiment, at least one contact is disposed on at least one of: the top surface and the bottom surface of the optoelectronic device and a pad is coupled to the optoelectronic device through at least one contact.

According to another embodiment, a height of the at least one contact is extendable beyond the functional tuning materials disposed on a same side of the at least one contact and wherein the at least one contact on one of: the top surface and the bottom surface of the optoelectronic device is connected to a least another contact on another surface of the optoelectronic device through a trace. The trace is separated from the optoelectronic device by a dielectric layer.

According to some embodiment, the encapsulation layer protects the color conversion materials from oxygen and moisture, the optical enhancement layer reflects the light into the color conversion materials, the reflective layer enhances the light coupling into the color conversion materials and the reflective layer is extended on one of: the top surface and the bottom surface of the optoelectronic device. The reflective layer comprises a reflective part and a transparent part.

According to other embodiments, the plurality of cover layers are deposited by one of: printing, evaporation, printing, and sputtering and patterned by one of: photolithography, liftoff and printing.

According to further embodiment, the one or more cover layers encircling the functional tuning materials between the at least one side surface and the one or more cover layers.

Figure 10A:
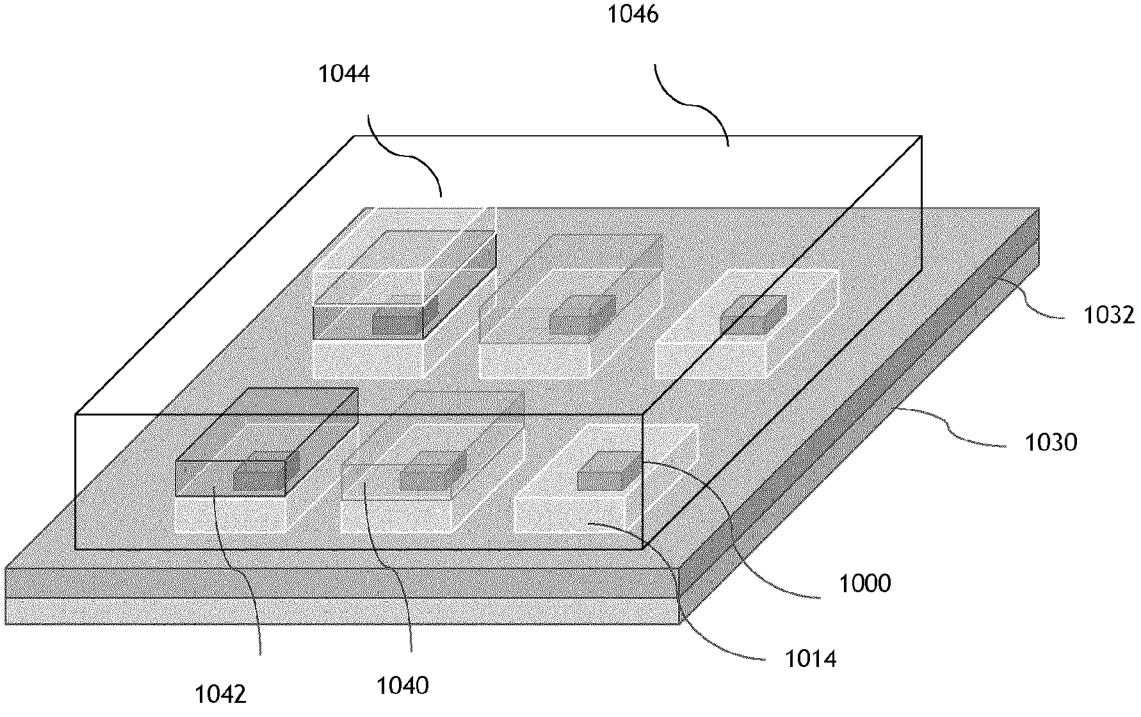
FIGS. 10A and 10B show integration of a light distribution layer into the combination of light emitting device and color conversion layer.
Figure 10B:
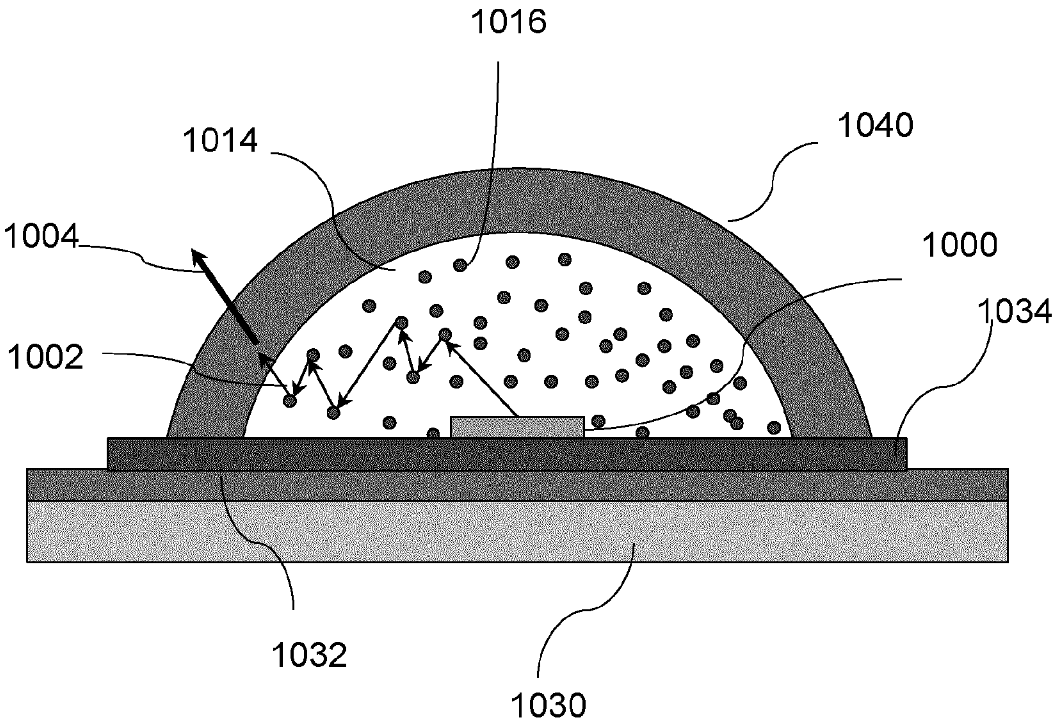

FIGS. 10A and 10B show integration of a light distribution layer into the combination of light emitting device and color conversion layer. The color conversion layer converts the color of a light emitting device into another color that is different from the original color of light emitting device. Here the light emitting devices 1000 can be a microLED formed or transferred into a backplane or substrate 1030. The backplane or substrate 1030 can have a circuitry controlling the light emitting devices 1000 and other layers such as a planarization layer 1032 and a contact layer 1034. A light distribution layer 1014 is formed on top of the light emitting device 1030. Here the shape of the light distribution layer 1014 can be thicker closer to the light emitting device 1030. The light distribution layer can be a combination of reflective nano-particles such as silver nano-particles, silver nano-wire, and so on, which are dispersed in a polymer solution. To further increase the effectiveness of the light distribution layer, the light emitting device 1030 can be directly or indirectly on a reflective layer. Furthermore, the distribution of reflective particles can be adjusted to increase the light uniformity. This can be achieved by different drying methods as well as different solutions. One example of drying can be drying the reflective layer in a control environment where the vapour pressure is controlled. This can control the speed of the solution evaporating from the layer. The speed of evaporation can cause the edge to dry first and so the material gets concentrated at the center and forms a dome shape which will result in thicker at the center. In another case, the material can get stamped to form a dome shape. The color conversion layers 1040 and 1042 are then formed on the light distribution layer 1014. The color conversion layers 1040 and 1042 can extend over the light distribution layer 1014. In one case, the color conversion layers 1040 and 1042 are quantum dots (QD). In another case, a color filter is formed on top of the color conversion layer 1040 and 1042. In another case, another light distribution layer 1044 is formed on top of the color conversion layer to further increase the conversion efficiency by passing the light back to the color conversion layer. Here, the internal reflection can be set so that the original light gets reflected more. Encapsulation layer 1046 may be used after the color conversion layer or after the color filter layer for improving the reliability of the layers. Some of the color conversion layers may be prone to degradation under exposure to some materials such as oxygen and moisture. The encapsulation layer 1046 can protect those layers from the oxygen and moisture. Furthermore, the encapsulation can provide further mechanical support for the micro device 1000.

In another case, the thickness of the light distribution layer is modified to increase the light reflectivity over the top of the device. FIG. 10B. shows an exemplary embodiment for such a structure. Here, the light distribution layer 1014 looks like a dome shape (it can be another shape following light emitting device structure 1000) on top of the light emitting device 1000. The light 1002 generated by the device 1000 is reflected with reflective particles 1016 and so distributed in the film 1014. After the light 1002 escapes the film 1014, it is converted to another color by the color conversion layer 1040 and emitted as another light 1004.

Figure 10C:
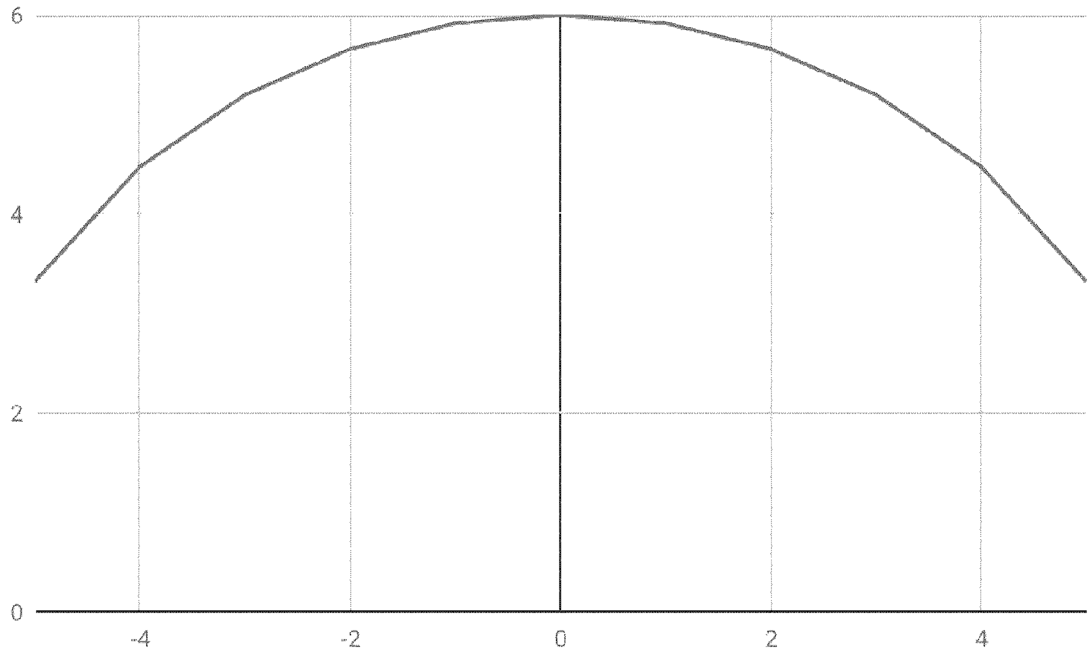
FIG. 10C shows the effective concentration ratio of reflective particles from the surface to the edge of the light distribution layer.

FIG. 10C. shows the effective concentration ratio of reflective particles from the surface to the edge of the light distribution layer 1030. As can be seen, more reflective particles are at the center of the structure or are disposed substantially at a center of the structure. The concentration of the reflective particles can be modulated to extend the lights towards an edge of the light distribution layer.

Methods Aspects

The invention discloses a method to convert a color of a light emitting device into another color. The method comprises forming the following: a backplane; a light emitting device on top of the backplane; a light distribution layer on top of the light emitting device; a color conversion layer on top of the light distribution layer; and converting the color of the light emitting device into another color that is different from the original color of light emitting device. Here, the backplane comprises circuitry to control the said light emitting device. Also, the backplane has a planarization layer on top, and the light emitting device is on top of a reflective layer. Furthermore, the light distribution layer reflective particles are inside a polymer, and the reflective particles are disposed substantially at the center of the light distribution layer. Also, a concentration of the reflective particles is modulated to extend the lights towards an edge of the light distribution layer. The distribution of the reflective particles can be adjusted to increase the light uniformity by different drying methods as well as different solutions. Additionally, the shape of the light distribution layer is thicker closer to the light emitting device, and the color conversion layer is a quantum dot and extends over the light distribution layer. Next, there is another light distribution layer on top of the color conversion layer to increase the conversion efficiency by passing the light back to the color conversion layer, which has a color filter on top of it. Lastly, an encapsulation layer is used after the color conversion layer to improve the reliability of the layers, and the light emitting devices are microLED's formed or transferred into the backplane or a substrate.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A solid state device comprising of:
- a backplane;
- a light emitting device on top of the backplane;
- an opaque or reflective layer covering or blocking undesired light paths from the light emitting device;
- a light distribution layer on top of the light emitting device, wherein the light distribution layer includes a higher concentration of reflective nano-particles at a center of the light distribution layer and a lower concentration of the reflective nano-particles at areas surrounding the center of the light distribution layer, wherein the reflective nano-particles include silver nano-particles or silver nano-wire and the reflective nano-particles are disposed only in the light distribution layer;
- a color conversion layer on top of the light distribution layer; and
- a layer on top or underneath of the color conversion layer for encapsulation or heat dissipation.

2. The solid state device of claim 1, wherein the backplane comprises circuitry to control the said light emitting device.

3. The solid state device of claim 1, wherein the backplane has a planarization layer on top.

4. The solid state device of claim 1, wherein the light emitting device is on top of a reflective layer.

5. The solid state device of claim 1, wherein the light emitting devices are microLED's formed or transferred into a backplane or substrate.

6. The solid state device of claim 1, wherein the reflective nano-particles are inside a polymer.

7. The solid state device of claim 1, wherein the color conversion layer extends over the light distribution layer.

8. The solid state device of claim 1, wherein the color conversion layer is a quantum dot.

9. The solid state device of claim 1, wherein a shape of the light distribution layer is thicker closer to the light emitting device.

10. The solid state device of claim 1, wherein there is another light distribution layer on top of the color conversion layer.

11. The solid state device of claim 1, wherein there is a color filter on top of the color conversion layer.

12. The solid state device of claim 1, wherein the light emitting devices are microLED's formed or transferred into the backplane or a substrate.

13. A method to convert a color of a light emitting device into another color, the method comprising:
- forming a backplane;
- forming a light emitting device on top of the backplane;

forming an opaque or reflective layer covering or blocking undesired light paths from the light emitting device;

forming a light distribution layer on top of the light emitting device, wherein the light distribution layer includes a higher concentration of reflective nano-particles at a center of the light distribution layer and a lower concentration of the reflective nano-particles at areas surrounding the center of the light distribution layer, wherein the reflective nano-particles include silver nano-particles or silver nano-wire and the reflective nano-particles are disposed only in the light distribution layer;

forming a color conversion layer on top of the light distribution layer;

forming a layer on top or underneath of the color conversion layer for encapsulation or heat dissipation; and converting the color of the light emitting device into another color that is different from the original color of the light emitting device.

14. The method of claim 13, wherein the backplane comprises circuitry to control the said light emitting device.

15. The method of claim 13, wherein the backplane has a planarization layer on top.

16. The method of claim 13, wherein the light emitting device is on top of a reflective layer.

17. The method of claim 13, wherein the reflective nano-particles are inside a polymer.

18. The method of claim 17, wherein a concentration of the reflective nano-particles is modulated to extend the lights towards an edge of the light distribution layer.

19. The method of claim 17, wherein a distribution of the reflective nano-particles can be adjusted to increase the light uniformity by different drying methods as well as different solutions.

20. The method of claim 13, wherein a shape of the light distribution layer is thicker closer to the light emitting device.

21. The method of claim 13, wherein the color conversion layer extends over the light distribution layer.

22. The method of claim 13, wherein the color conversion layer is a quantum dot.

23. The method of claim 13, wherein there is another light distribution layer on top of the color conversion layer to increase a conversion efficiency by passing the light back to the color conversion layer.

24. The method of claim 13, wherein there is a color filter on top of the color conversion layer.

25. The method of claim 13, where an encapsulation layer is used after the color conversion layer to improve the reliability of the layers.

26. The method of claim 13, wherein the light emitting devices are microLED's formed or transferred into the backplane or a substrate.

* * * * *